US007919760B2

(12) United States Patent
Jau et al.

(10) Patent No.: US 7,919,760 B2
(45) Date of Patent: Apr. 5, 2011

(54) OPERATION STAGE FOR WAFER EDGE INSPECTION AND REVIEW

(75) Inventors: Jack Jau, Los Altos Hills, CA (US); Hong Xiao, Pleasanton, CA (US); Joe Wang, Campbell, CA (US); Zhongwei Chen, San Jose, CA (US); Yi Xiang Wang, Fremont, CA (US); Edward Tseng, Hsinchu (TW)

(73) Assignee: Hermes-Microvision, Inc., Hsinchu (TW)

( * ) Notice: Subject to any disclaimer, the term of this patent is extended or adjusted under 35 U.S.C. 154(b) by 225 days.

(21) Appl. No.: 12/331,336

(22) Filed: Dec. 9, 2008

(65) Prior Publication Data

US 2010/0140498 A1 Jun. 10, 2010

(51) Int. Cl.
*G21K 5/10* (2006.01)
(52) U.S. Cl. .................. 250/442.11; 250/310; 324/751; 356/237.2
(58) Field of Classification Search .............. 250/442.11, 250/310; 324/751, 760, 158.1; 356/237.2
See application file for complete search history.

(56) References Cited

U.S. PATENT DOCUMENTS

| 4,068,123 A | 1/1978 | Kokubo |
| 4,675,524 A | 6/1987 | Frosien et al. |
| 4,700,075 A | 10/1987 | Kurz et al. |
| 4,713,543 A | 12/1987 | Feuerbaum et al. |
| 4,728,790 A | 3/1988 | Plies |
| 4,808,821 A | 2/1989 | Feuerbaum et al. |
| 4,818,874 A | 4/1989 | Ishikawa |

(Continued)

FOREIGN PATENT DOCUMENTS

DE 3925949 A1 2/1991

OTHER PUBLICATIONS

Ronnie Porat, et al., "SEM-based methodology for root cause analysis of wafer edge and bevel defects" 2008 IEEE/SEMI Advanced Semiconductor Manufacturing Conference.

(Continued)

*Primary Examiner* — Kiet T Nguyen
(74) *Attorney, Agent, or Firm* — Sawyer Law Group. P.C.

(57) ABSTRACT

The present invention relates to an operation stage of a charged particle beam apparatus which is employed in a scanning electron microscope for substrate (wafer) edge and backside defect inspection or defect review. However, it would be recognized that the invention has a much broader range of applicability. A system and method in accordance with the present invention provides an operation stage for substrate edge inspection or review. The inspection region includes top near edge, to bevel, apex, and bottom bevel. The operation stage includes a supporting stand, a z-stage, an X-Y stage, an electrostatic chuck, a pendulum stage and a rotation track. The pendulum stage mount with the electrostatic chuck has the ability to swing from 0° to 180° while performing substrate top bevel, apex and bottom bevel inspection or review. In order to keep the substrate in focus and avoid a large position shift during altering the substrate observation angle by rotation the pendulum stage, one embodiment of the present invention discloses a method such that the rotation axis of the pendulum stage consist of the tangent of upper edge of the substrate to be inspected. The electrostatic chuck of the present invention has a diameter smaller than which of the substrate to be inspected. During the inspection process the substrate on the electrostatic chuck may be rotated about the central axis on the electrostatic chuck to a desired position, this design insures all position on the bevel and apex are able to be inspected.

10 Claims, 7 Drawing Sheets

The operation stage with e-beam column

U.S. PATENT DOCUMENTS

| | | | |
|---|---|---|---|
| 4,831,266 A | 5/1989 | Frosien et al. | |
| 4,926,054 A | 5/1990 | Frosien | |
| 5,004,918 A | 4/1991 | Tsuno | |
| 5,198,675 A | 3/1993 | Hikita et al. | |
| 5,498,874 A | 3/1996 | Miyoshi et al. | |
| 5,665,968 A | 9/1997 | Meisburger et al. | |
| 5,717,204 A | 2/1998 | Meisburger et al. | |
| 5,872,358 A | 2/1999 | Todokoro et al. | |
| 6,194,729 B1 | 2/2001 | Weimer | |
| 6,365,896 B1 | 4/2002 | van der Mast | |
| 6,380,546 B1 | 4/2002 | Petrov et al. | |
| 6,392,231 B1 | 5/2002 | Chen | |
| 6,407,387 B1 | 6/2002 | Frosien et al. | |
| 6,426,501 B1 | 7/2002 | Nakagawa | |
| 6,462,467 B1 | 10/2002 | Russ | |
| 6,463,124 B1 | 10/2002 | Weisman et al. | |
| 6,545,277 B1 | 4/2003 | Kella et al. | |
| 6,605,805 B2 | 8/2003 | Chen | |
| 6,617,579 B2 | 9/2003 | Yonezawa | |
| 6,642,520 B2 | 11/2003 | Kimura et al. | |
| 6,768,324 B1 | 7/2004 | Yamada et al. | |
| 6,775,452 B2 | 8/2004 | Howells | |
| 6,853,143 B2 | 2/2005 | Nakasuji et al. | |
| 6,855,938 B2 | 2/2005 | Preikszas et al. | |
| 6,960,766 B2 | 11/2005 | Chen | |
| 6,972,412 B2 | 12/2005 | Scholtz et al. | |
| 6,975,125 B2 | 12/2005 | Yamada et al. | |
| 7,067,807 B2 | 6/2006 | Petrov et al. | |
| 7,098,468 B2 | 8/2006 | Aloni et al. | |
| 7,161,667 B2 | 1/2007 | Meeks et al. | |
| 7,180,317 B2 * | 2/2007 | Hollman | 324/760 |
| 7,312,449 B2 | 12/2007 | Nakasuji et al. | |
| 7,385,195 B2 | 6/2008 | Yamada et al. | |
| 7,521,700 B2 | 4/2009 | Aloni et al. | |
| 7,544,937 B2 | 6/2009 | Frosien | |
| 7,598,499 B2 | 10/2009 | Platzgummer | |
| 7,612,337 B2 | 11/2009 | Suzuki et al. | |
| 7,645,989 B2 | 1/2010 | Bihr et al. | |
| 7,652,263 B2 | 1/2010 | Feuerbaum | |
| 7,705,298 B2 | 4/2010 | Liu et al. | |
| 7,705,301 B2 | 4/2010 | Tseng et al. | |
| 7,759,653 B2 | 7/2010 | Chen et al. | |
| 2003/0155509 A1 | 8/2003 | Nakasuji et al. | |
| 2004/0239347 A1 | 12/2004 | Yamada et al. | |
| 2005/0023491 A1 * | 2/2005 | Young et al. | 250/559.42 |
| 2005/0133733 A1 | 6/2005 | Nakasuji et al. | |
| 2006/0202119 A1 | 9/2006 | Yamada et al. | |
| 2006/0243918 A1 | 11/2006 | Aloni et al. | |
| 2008/0067380 A1 | 3/2008 | Ozawa et al. | |
| 2008/0099693 A1 | 5/2008 | Platzgummer | |
| 2008/0217529 A1 | 9/2008 | Sukegawa et al. | |
| 2008/0315094 A1 | 12/2008 | Wang et al. | |
| 2009/0090866 A1 | 4/2009 | Zhang et al. | |
| 2009/0242792 A1 | 10/2009 | Hosoya et al. | |
| 2009/0294664 A1 | 12/2009 | Chen et al. | |
| 2010/0028235 A1 | 2/2010 | Qin et al. | |
| 2010/0118310 A1 | 5/2010 | Matsui | |
| 2010/0150429 A1 | 6/2010 | Jau et al. | |

OTHER PUBLICATIONS

Jaime D. Morillo, et al., "Edge and Bevel Automated Defect Inspection for 300mm Production Wafers in Manufacturing" 2005 IEEE/SEMI Advanced Semiconductor Manufacturing Conference.

ZhongWei Chen, et al., U.S. Appl. No. 12/257,304; "An Electron Beam Apparatus" filed Oct. 23, 2008.

Ludwig Reimer, "Image Formation in Low-Voltage Scanning Electron Microscopy", SPIE Optical Engineering Press, Tutorial Texts vol. TT12, 1993, 16 total pages (pp. 12, 13, 28-41, 88-101).

K. Tsuno, "Aberration Analysis of a Wein Filter for Electrons", Wissenschftliche Verlagsgesellschaft mbH Stuugart, vol. 89-No. 1, 1991, pp. 31-40.

* cited by examiner

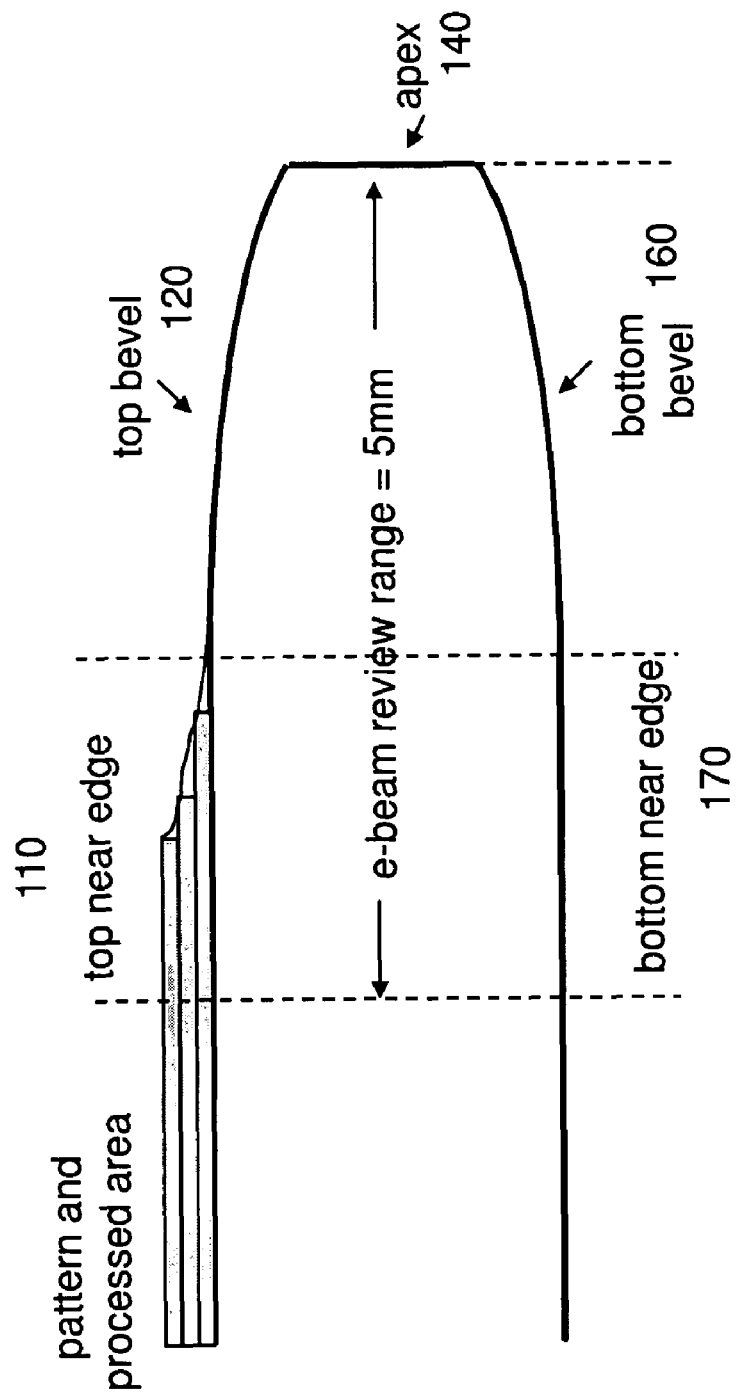
Figure 1 Edge Region of Interest

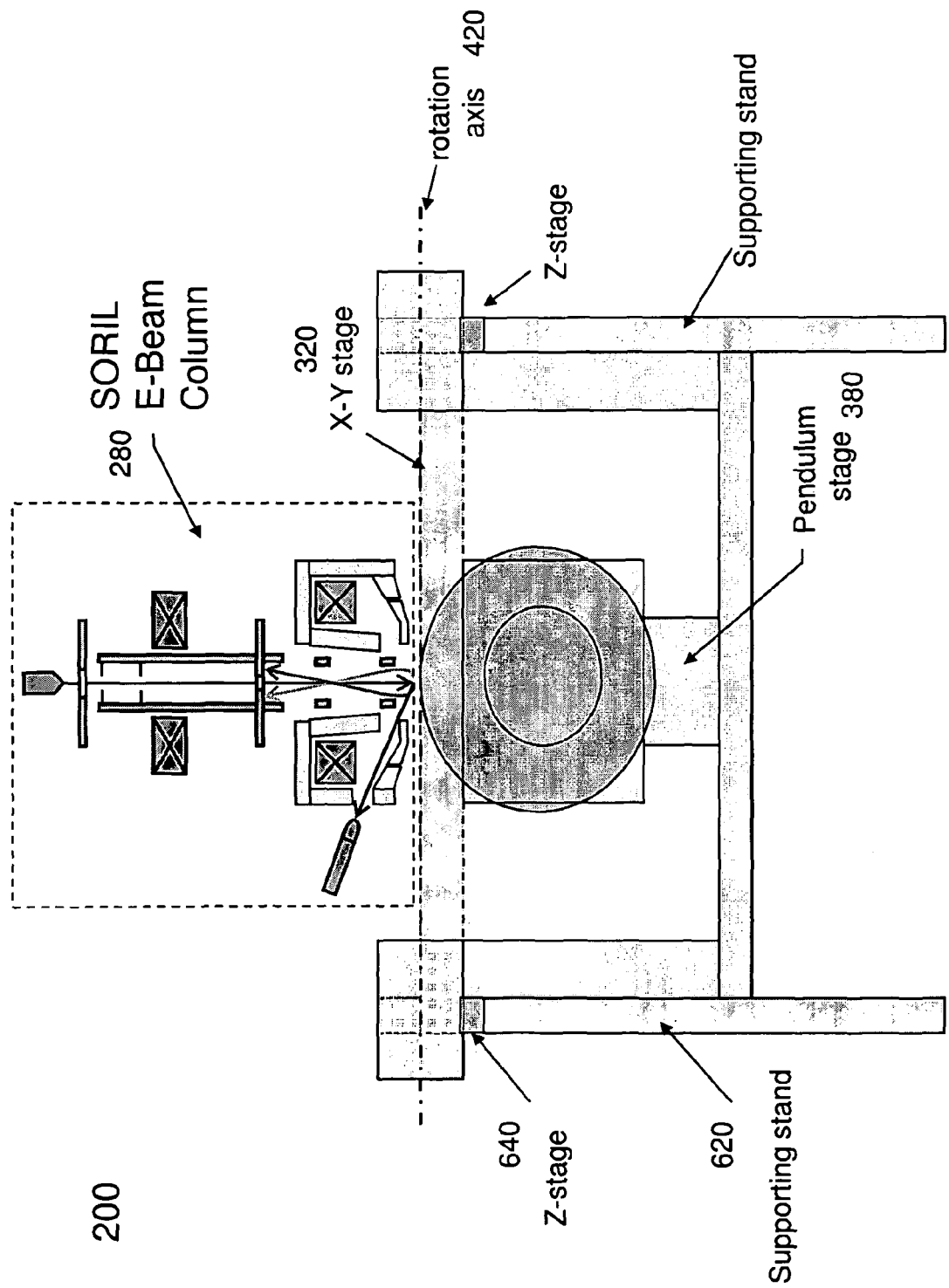
Figure 2 The operation stage with e-beam column

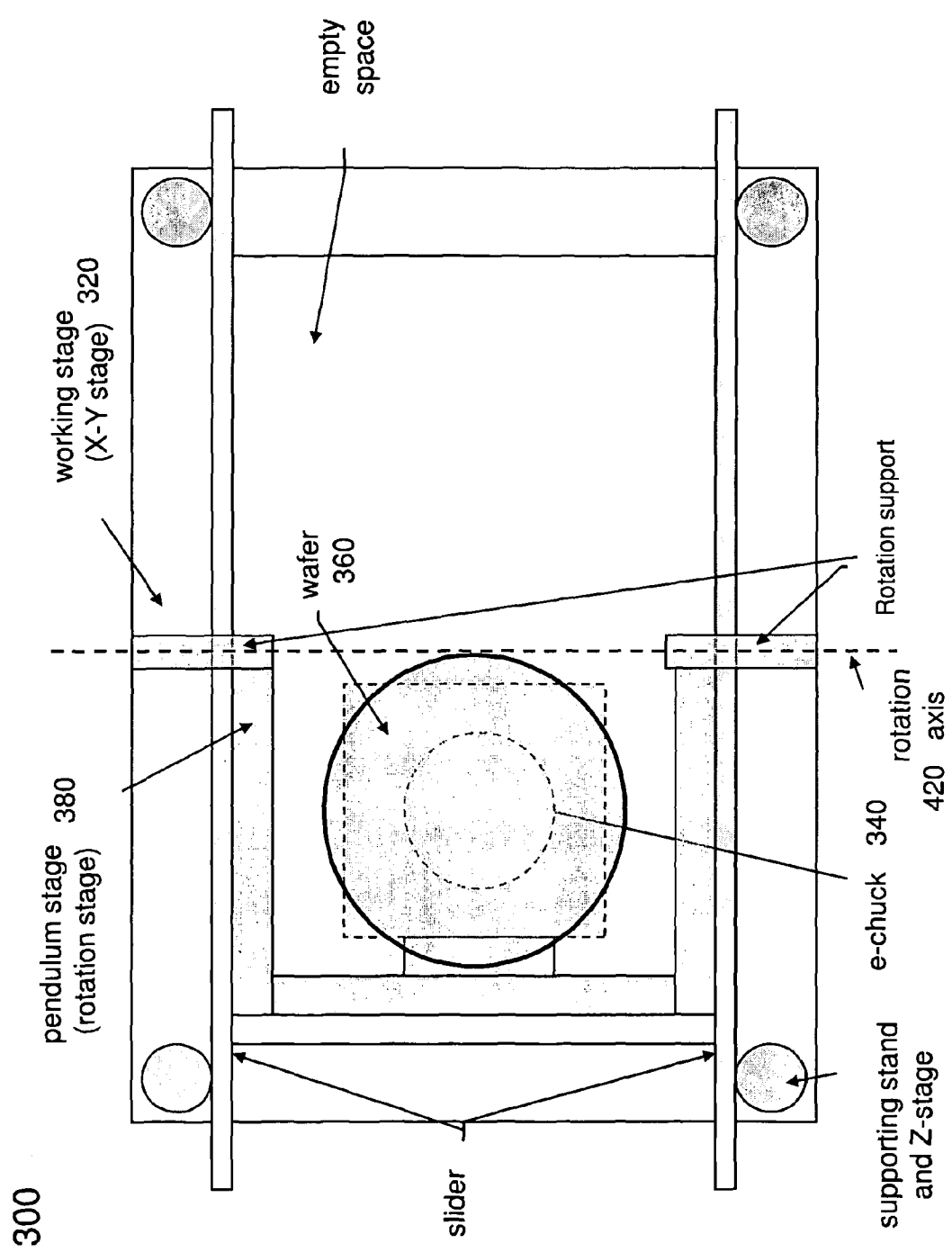
Figure 3 Top view of the operation stage –inspecting top bevel

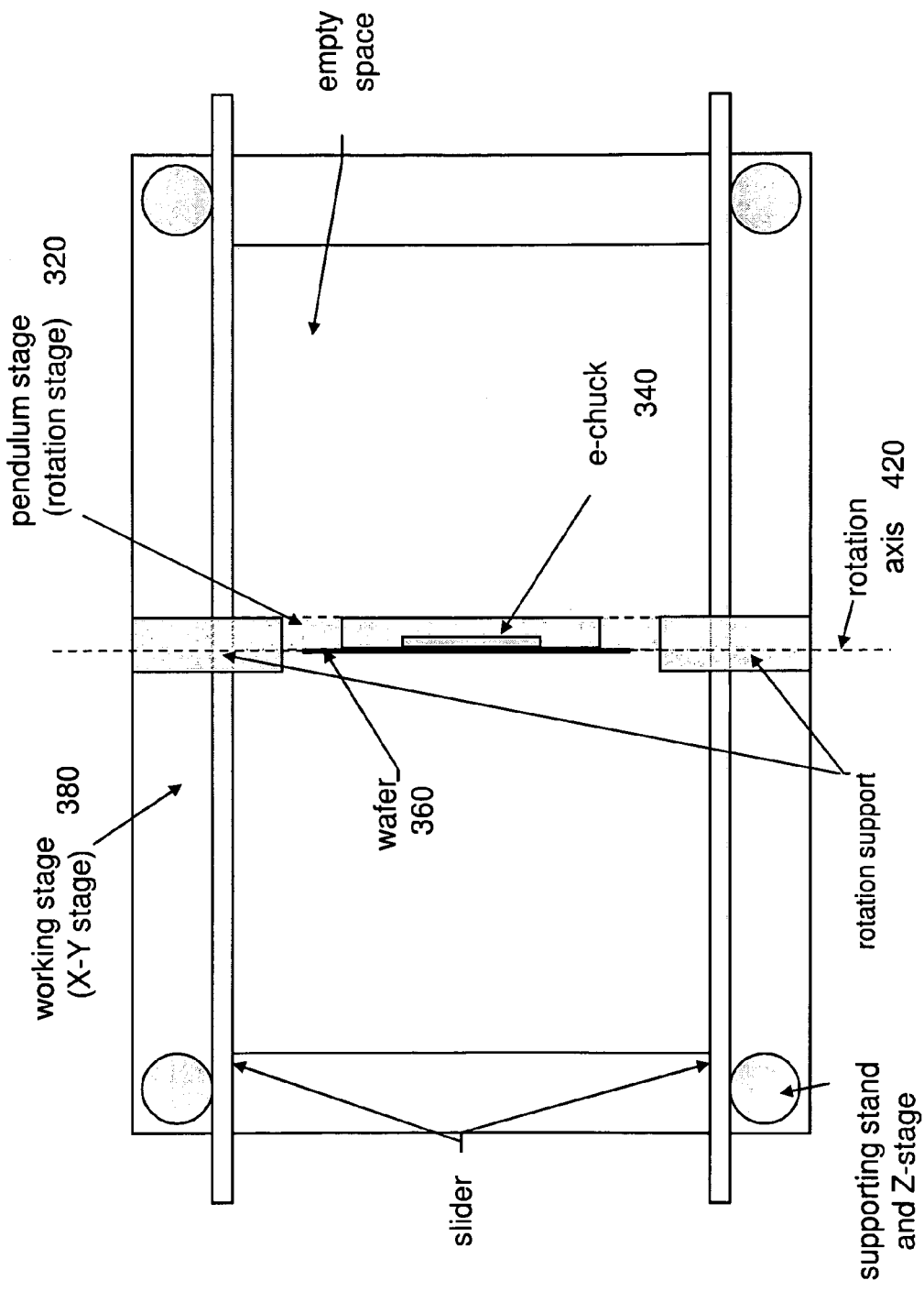
Figure 4 Top view of the operation stage – inspecting apex

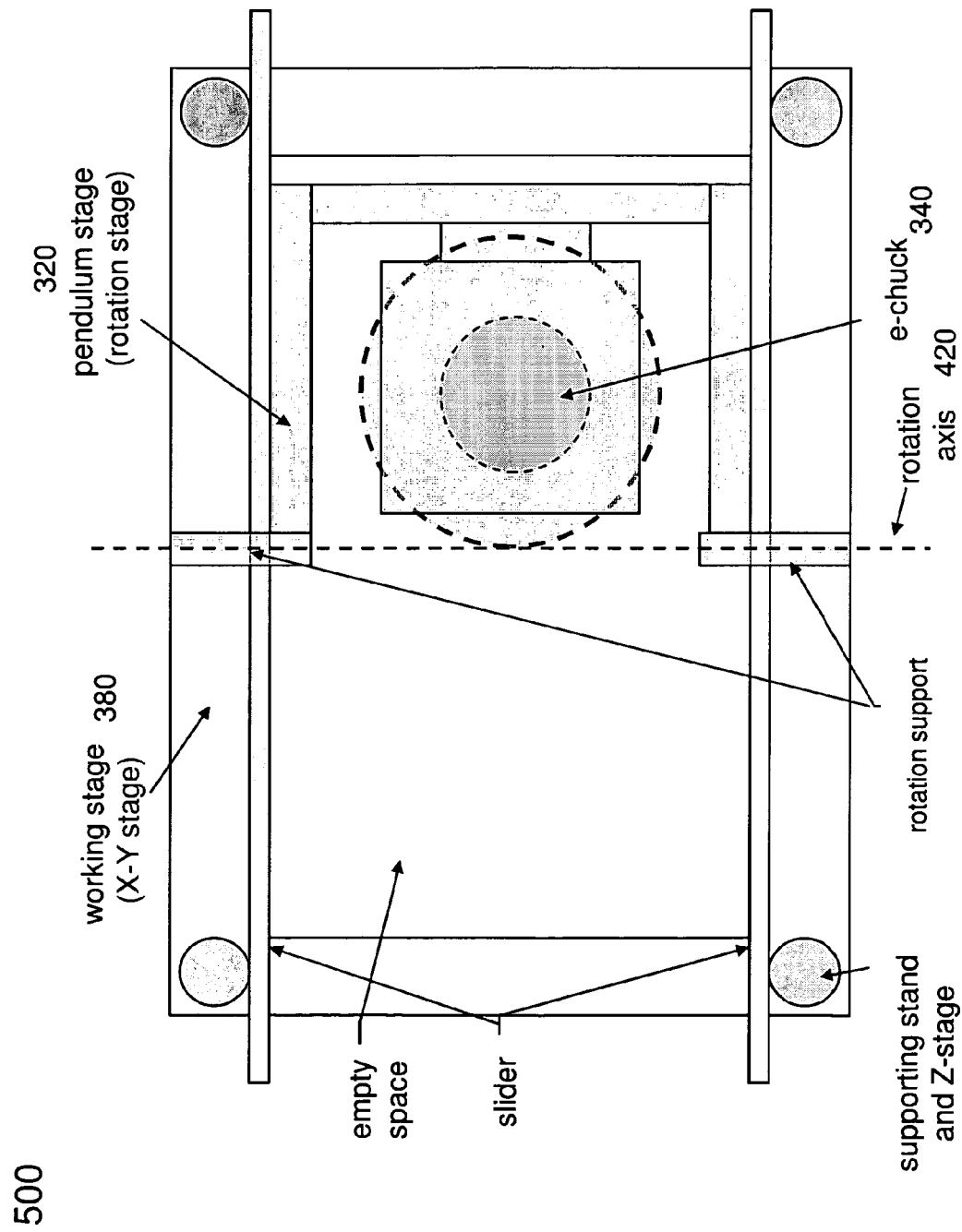
Figure 5 Top view of the operation stage – inspecting bottom bevel

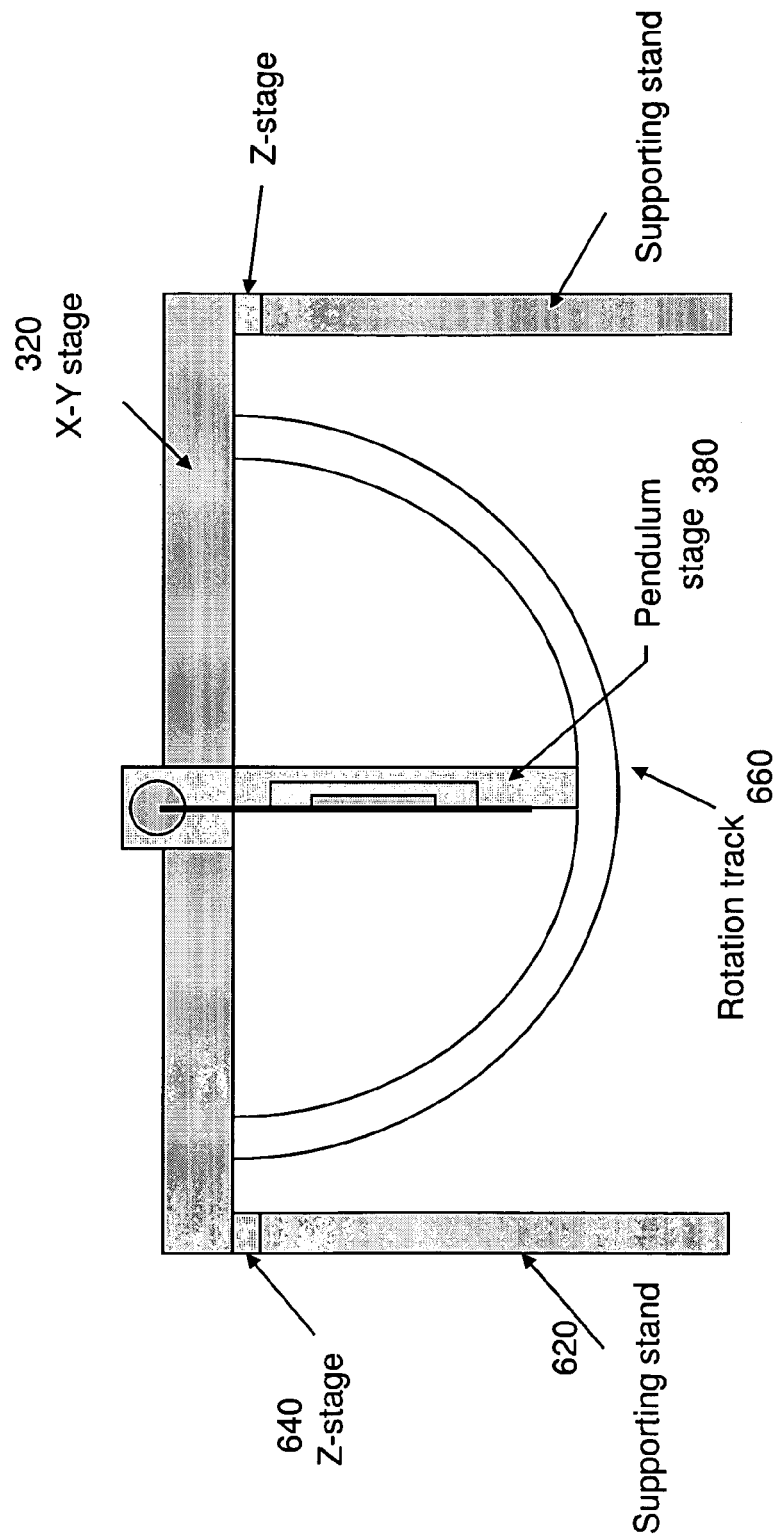
Figure 6 Side view of the operation stage – inspecting apex

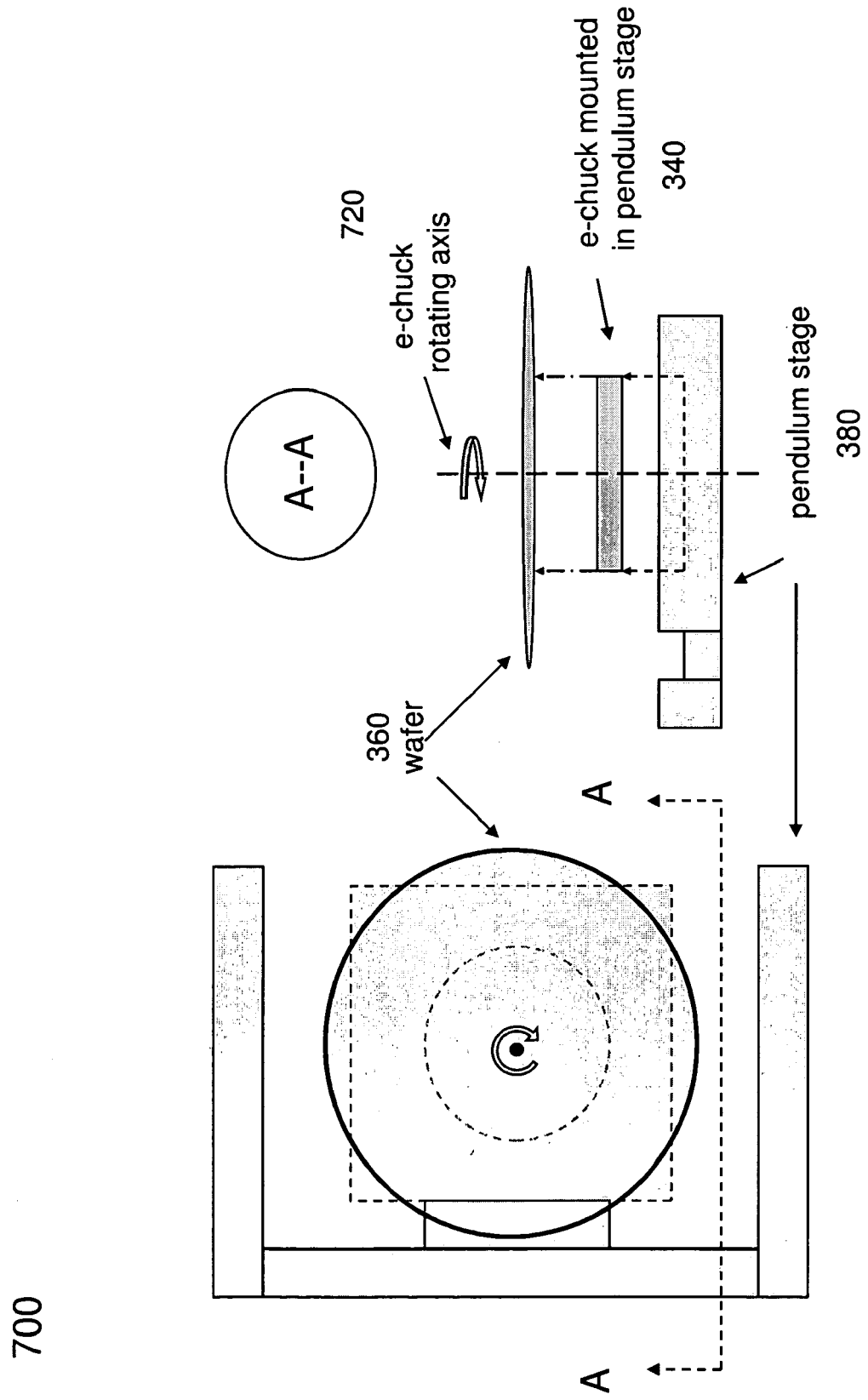
Figure 7: the relationship between the pendulum stage, the e-chuck, wafer and the rotation axis

OPERATION STAGE FOR WAFER EDGE INSPECTION AND REVIEW

FIELD OF THE INVENTION

The present invention relates to an operation stage of a charged particle beam apparatus which is employed in a scanning electron microscope for substrate (wafer) edge and backside defect inspection or defect review. However, it would be recognized that the invention has a much broader range of applicability.

BACKGROUND OF THE INVENTION

Charged particle beam apparatus are typically employed in scanning electron microscopy (SEM), which is a known technique used in semiconductor manufacturing. Traditionally, the wafer edge has been of secondary concern to semiconductor manufacturers, since it was considered a non-active area. However, there is a growing industry awareness that wafer edge and backside conditions impact yields, directly and indirectly. A 300 mm wafer may contain as much as 25% of the devices at its outer edge, and a recently published benchmark study has demonstrated that yield can decrease by as much as 50% at the wafer's edge. While there are varying causes for this yield loss, chipmakers are increasingly aware of the need to manage defect source at the wafer's edge. For instance, a scratch on the bottom of a wafer can cause a hot spot on the top. A large scratch or residual slurry on the bevel can flake or peel off, depositing particles on the topside that cause defects.

In addition to affecting yield, defects may adversely impact the availability of the lithography equipment. The need for well characterized and methodical edge and bevel defect control becomes even greater with the introduction of immersion lithography for 45 nm technology node. Immersion increases the need for tighter edge control because of new edge defect creation mechanisms and because of higher risk of edge defects migrating to wafer patterned area with immersion liquid flow. The immersion fluid may pick up and deposit particles from the bevel region onto the wafer.

Defects sources impacting yield include traditional films (silicon oxide, silicon nitride and polymers), new materials such as porous low-k and organic films. Porous low-k film often does not adhere as well as traditional silicon- or polymer-based films and, therefore, can be significant defect sources. Tensile films such as amorphous carbon also may adhere poorly at the edge of the wafer and can peel off in long strips that tend to ball up, creating particle sources.

Although edge and bevel defects are typically large (several microns and above) and can be detected by optical microscope, comprehensive analysis of these defects requires the high resolution and image contrast provided by SEM. Optically, many of the defects appear as a small spot, whereas the SEM image reveals their true morphology. Understanding the defect's elemental composition can provide many clues to its origin and cause. Therefore, the ability to analyze the defect material has tremendous added value.

A system and method in accordance with the present invention addresses defect and inspection review in an effective manner in a wafer edge.

SUMMARY OF THE INVENTION

The present invention relates to an operation stage of a charged particle beam apparatus which is employed in a scanning electron microscope for substrate (wafer) edge and backside defect inspection or defect review. However, it would be recognized that the invention has a much broader range of applicability.

A system and method in accordance with the present invention provides an operation stage for substrate edge inspection or review. The inspection region includes top near edge, to bevel, apex, and bottom bevel. The operation stage includes a supporting stand, a z-stage, an X-Y stage, an electrostatic chuck, a pendulum stage and a rotation track. The pendulum stage mount with the electrostatic chuck has the ability to swing from 0° to 180° while performing substrate top bevel, apex and bottom bevel inspection or review.

In order to keep the substrate in focus and avoid a large position shift during altering the substrate observation angle by rotation the pendulum stage, one embodiment of the present invention discloses a method such that the rotation axis of the pendulum stage consist of the tangent of upper edge of the substrate to be inspected.

The electrostatic chuck of the present invention has a diameter smaller than which of the substrate to be inspected. During the inspection process the substrate on the electrostatic chuck may be rotated about the central axis on the electrostatic chuck to a desired position, this design insures all position on the bevel and apex are able to be inspected.

BRIEF DESCRIPTION OF THE DRAWINGS

The present invention will be readily understood by the following detailed description in conjunction with the accompanying drawings, wherein like reference numerals designate like structural elements, and in which:

FIG. 1 is a schematic diagrammatic representation of the wafer edge region.

FIG. 2 is a schematic diagrammatic representation of the edge inspection system of the present invention.

FIG. 3 is a schematic diagrammatic representation of the operation position while inspecting or reviewing front side of the wafer, as an example of present invention.

FIG. 4 is a schematic diagrammatic representation of the operation position while inspecting or reviewing edge of the wafer, as an example of present invention.

FIG. 5 is a schematic diagrammatic representation of the operation position while inspecting or reviewing back side of the wafer, as an example of present invention.

FIG. 6 is a schematic diagrammatic representation of side view of the operation stage.

FIG. 7 is a schematic diagrammatic representation of the relationship between the pendulum stage, the electrostatic chuck, wafer and the rotation axis.

DETAILED DESCRIPTION OF THE INVENTION

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well known process operations are not been described in detail in order not to unnecessarily obscure the present invention.

This invention presents an operation stage of a charged particle beam apparatus which is employed in a scanning electron microscope for substrate (wafer) edge and backside defect inspection and defect review. The metrology and stereo image of the defect can be revealed under the high resolution and high performance SEM. However, it would be recognized that the invention has a much broader range of applicability.

As device architecture line width becomes finer, the wafer's edge cannot be disregarded when inspecting and reviewing the architecture for defects. A prime mover behind detecting these defects is the need to reduce progressively worse surface contamination that may migrate from a rough, pitted or fractured edge. Also it is realized that 5 to 7% of the wafer surface area is missed if edge inspection is not done. The edge is composed of three sections: the top bevel 120, the apex 140, and the bottom bevel 160 as illustrated in FIG. 1. The bevel and apex make up the area of the wafer beyond the pattern and process usually at least 2 to 3 mm from the physical edge of the wafer.

Contrary to the wafer patterned surface which is well characterized, monitored and controlled through inspection (optical or e-beam based) and review (usually e-beam based), the defect identification ability beyond the wafer's edge is a new frontier for yield enhancement. The defect inspection around the wafer edge was done mostly by an optical device, for example, as described in U.S. Pat. No. 7,161,667 by Meeks et al. However, there is only limited paper reported that defect around the edge analyzed by SEM (Porat et al. 2008 IEEE/SEMI Advanced Semiconductor Manufacturing Conference, "SEM-based methodology for root cause analysis of wafer and bevel defects"). The reason is as follows. In order to have a good image quality from the top bevel to the apex then to the bottom bevel, the inspecting source (UV light or e-beam) should rotate around and keep normal to or within a range of normal to the substrate surface. It is much easier to move or rotate an optical device around the wafer edge to have a quality image than moving a heavy e-beam column without increasing vibration and background noise to the image. Currently, the best an e-beam system can provide is by tilting the column by 45°.

One embodiment of the present invention discloses an operation stage of an e-beam system that can rotate between 0° and 180° to have the inspecting area always face to the electron beam. FIG. 2 illustrates the operation stage with an e-beam column on the system.

The operation stage includes a supporting stand 620 that may sustain the weight of the system; a z-stage 640 that may provides the stage degree of freedom in vertical direction respect to the ground; an X-Y stage 320 that may provides the stage degree of freedom in the two horizontal direction respect to the ground; an electrostatic chuck 340 that holds the substrate 360 to be inspect or review by electrostatic force; and most of all a pendulum stage 380 for mounting the electrostatic chuck 340 on and have the ability to swing from 0° to 180° while performing top bevel, apex and bottom bevel inspection or review. FIG. 3 illustrates a top view of the operation stage at the normal position. In this position, the system can loading or unloading the substrate to be inspected 360 and the system can performing the top near edge 110, top bevel 120 inspection. Since the bevel gradually altering its slope, the pendulum stage 380 may also vary its rotation degree respectively during top bevel 120 and bottom bevel 160 inspection. A rotation track 660 is designed for the pendulum stage 380 to provide support increase stabilization and reduce vibration during bevel inspection.

FIG. 4 illustrates the top view of the operation stage while performing apex 140 inspection or review. At this position, the pendulum stage 380 is rotating to 90° angle respect to the original starting position. In order to keep the substrate in focus and avoid a large position shift during altering the substrate observation angle by rotation the pendulum stage 380, one embodiment of the present invention discloses a method such that the rotation axis 420 of the pendulum stage 380 consists of the tangent of upper edge of the substrate to be inspected 360. With this design the vertical distance shift during the 90° rotation is about the thickness of the substrate, for example 775 micron for a 300 mm wafer. The horizontal distance shift from 0° to 180° is about 2 thickness of the substrate, for example 1.55 mm for a 300 mm wafer. These distance shift can be easily compensated by a regular z-stage and X-Y stage. FIG. 5 illustrates another top view of the operation stage position while performing bottom bevel 160 inspection or review.

In order to reveal the backside or the bottom bevel of the wafer, one embodiment of the present invention includes a round shaped electrostatic chuck 340 that has a diameter smaller than which of the substrate to be inspected. Of course the shape of the electrostatic chuck could be any shape but must reveal the portion the substrate to be inspected. During the inspection process the substrate on the electrostatic chuck may be rotated about the central axis 720 of the electrostatic chuck 340 to a desired position, which may be connected to a suitable motor (not show) or other drive assembly for inducing rotational motion to the electrostatic chuck 340. With this design all the position on the top near edge 110, top bevel 120, apex 140, bottom bevel 160 and bottom near edge 170 could be inspected. FIG. 7 illustrates relationship between the pendulum stage, the electrostatic chuck, wafer and the rotation axis.

The operation stage of the present invention combines with a review or inspection column become a system that can perform substrate edge inspection or review. For example, equipped with the column disclosed by Chen et al., U.S. patent application Ser. No. 12/257,304 filed in Oct. 23, 2008 entitled "Electron Beam Apparatus", the present invention will become an edge review station with high resolution, high throughput and able to do material analysis.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended.

What is claimed is:

1. An operation stage system for edge and backside substrate inspection and review, comprising:
    a supporting frame to sustain the weight of the system;
    a stage to adjust variation of a focus of an e-beam image in z (vertical) direction;
    a station to adjust variation of a focus of the e-beam image in X and Y (horizontal) direction;
    an electrostatic chuck to hold the substrate by electrostatic force;
    a pendulum stage to mount the electrostatic chuck, the pendulum stage can swing from 0° to 180° while performing top bevel, apex and bottom bevel inspection or review; and
    a rotation track for the pendulum stage, which provides support and stabilizes the pendulum stage during the edge inspection and review.

2. The operation stage system of claim 1, wherein the electrostatic chuck has ability to rotate to a desired angle with respect to a substrate notch for edge inspection and review.

3. The operation stage system of claim 1, wherein the electrostatic chuck holds the substrate in such a way that the rotation axis of the pendulum stage consists of the tangent of upper edge of the substrate.

4. The operation stage system of claim 1, wherein the electrostatic chuck is mounted on the pendulum stage.

5. The operation stage system of claim 1, wherein the diameter of the electrostatic chuck is smaller than that of the substrate.

6. A method for edge and side substrate inspection and review comprising:
 adjusting for variation of a focus of an e-beam image in a vertical direction;
 holding the substrate by electrostatic force;
 adjusting the variation of the focus of the e-beam image in a horizontal direction; and
 swinging the substrate from 0° to 180° while performing top bevel, apex and bottom bevel inspection and review.

7. The method of claim 6, wherein an electrostatic chuck has ability to rotate to a desired angle with respect to a substrate notch for edge inspection and review.

8. The method of claim 6, wherein an electrostatic chuck holds the substrate in such a way that the rotation axis of a pendulum stage consists of the tangent of upper edge of the substrate.

9. The method of claim 6, wherein an electrostatic chuck is mounted on a pendulum stage.

10. The method of claim 6, wherein the diameter of an electrostatic chuck is smaller than that of the substrate.

* * * * *